United States Patent
Honjoh et al.

(10) Patent No.: US 7,205,611 B2
(45) Date of Patent: Apr. 17, 2007

(54) SEMICONDUCTOR DEVICE INCLUDING A PROTECTION CIRCUIT

(75) Inventors: Atsushi Honjoh, Tokyo (JP); Takayuki Hiraoka, Kawasaki (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 576 days.

(21) Appl. No.: 10/805,040

(22) Filed: Mar. 18, 2004

(65) Prior Publication Data
US 2005/0098830 A1    May 12, 2005

(30) Foreign Application Priority Data
Nov. 7, 2003   (JP) .............. 2003-378630

(51) Int. Cl.
*H01L 23/62*   (2006.01)
(52) U.S. Cl. .............. 257/355; 257/360; 257/173
(58) Field of Classification Search ........ 257/355, 257/360, 368, 369, 133, 173
See application file for complete search history.

(56) References Cited
U.S. PATENT DOCUMENTS
5,072,273 A   12/1991   Avery

2005/0098830 A1*   5/2005   Honjoh et al. ............ 257/355

OTHER PUBLICATIONS

Russ, et al., "GGSCRs:GGNMOS Triggered Silicon Controlled Rectifiers for ESD Protection In Deep Sub-Micron CMOS Process," Electrical Overstress/Electostatic Discharge Symposium Proceedings, 2001 by ESD Association and Sarnoff Corporation, pp. 01-22.

* cited by examiner

Primary Examiner—Mark V. Prenty
(74) Attorney, Agent, or Firm—DLA Piper US LLP

(57) ABSTRACT

A semiconductor device includes a protection circuit protecting a semiconductor integrated circuit from electrostatic discharge, the protection circuit has a detection circuit detecting the electrostatic discharge, a trigger circuit generating a trigger signal based on the output signal of the detection circuit, and a thyristor having a PNP transistor and an NPN transistor, and operating by the trigger signal from the trigger circuit, the PNP transistor having an emitter connected to a first terminal of the semiconductor device, the NPN transistor having an emitter connected to a second terminal of the semiconductor device and a collector connected to base of the PNP transistor. The protection circuit further has a switching element controlling the connected between the PNP and NPN transistors in accordance with the output signal of the detection circuit.

18 Claims, 10 Drawing Sheets

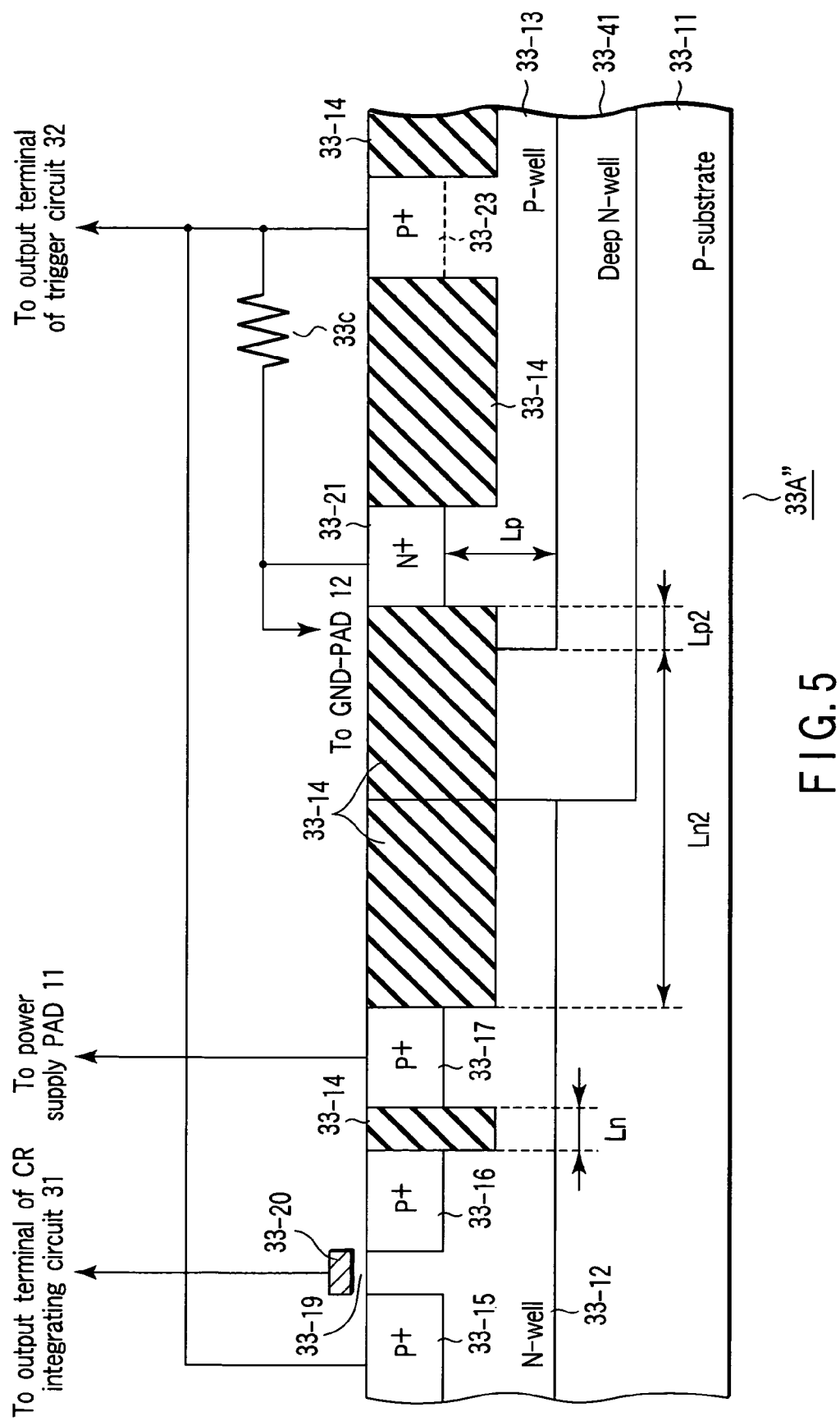
F I G. 5

SEMICONDUCTOR DEVICE INCLUDING A PROTECTION CIRCUIT

CROSS-REFERENCE TO RELATED APPLICATIONS

This application is based upon and claims the benefit of priority from the prior Japanese Patent Application No. 2003-378630, filed Nov. 7, 2003, the entire contents of which are incorporated herein by reference.

BACKGROUND OF THE INVENTION

1. Field of the Invention

The present invention relates to a semiconductor device including a protection circuit. More specifically, the present invention relates to an integrated circuit device including an AC trigger break (cut-off) type thyristor for protecting a semiconductor integrated circuit from breakdown by electrostatic discharge (ESD).

2. Description of the Related Art

Usually, an integrated circuit device is provided with an electrostatic discharge protection circuit (hereinafter, referred to as ESD protection circuit) for protecting a semiconductor integrated circuit from breakdown by electrostatic discharge. (For example, see Christian C. Russ et al., "GGSCRs: GGNMOS Triggered Silicon Controlled Rectifiers for ESD protection in Deep Sub-Micron CMOS Processes", ELECTRICAL OVERSTRESS/ELECTROSTATIC DISCHARGE SYMPOSIUM PROCEEDINGS 2001 (23rd).)

FIG. 9 shows the basic configuration of an integrated circuit device provided with a conventional ESD protection circuit. As shown in FIG. 9, the protection target, that is, a semiconductor integrated circuit (protection target device) 20 is connected between a power supply terminal (power supply PAD) 11 and a ground terminal (GDN-PAD) 12. An ESD protection circuit 30 and a protection diode 40 are connected in parallel with the semiconductor integrated circuit 20 between the power supply PAD 11 and the GDN-PAD 12. A power supply interconnect (wiring) resistance R1 and a ground interconnect (wiring) resistance R2 are interposed between the semiconductor integrated circuit 20 and the ESD protection circuit 30.

The ESD protection circuit 30 discharges positive ESD surge current supplied between the power supply PAD 11 and the GND-PAD 12 based on the GND-PAD 12. The protection diode 40 discharges negative ESD surge current.

FIG. 10 shows the configuration of the conventional ESD protection circuit 30. Here, an AC trigger break-type thyristor is given as one example. In this case, the ESD protection circuit 30 is composed of CR integrating circuit 31, trigger circuit 32 and thyristor 33.

In the CR integrating circuit 31, a resistance element (R) 31a is an N-well resistor having a resistance value of 1 MΩ, which is formed on a P type semiconductor substrate ($33_{-1}$). A capacitance element (C) 31b is a MOS (Metal Oxide Semiconductor) capacitor having a capacitance value of 6 pF. One terminal of the CR integrating circuit 31 comprising two elements 31a and 31b, that is, one terminal of the resistance element 31a is connected to the power supply PAD 11. The other terminal of the resistance element 31a is connected to one terminal (one electrode) of the capacitor element 31b. The other terminal of the CR integrating circuit 31, that is, the other terminal (the other electrode) of the capacitor element 31b is connected to the GND-PAD 12. A connection point between the resistance element 31a and the capacitor element 31b, that is, an output terminal (intermediate terminal) of the CR integrating circuit 31 is connected to an input terminal of the trigger circuit 32.

The trigger circuit 32 comprises a CMOS (Complementary MOS) structure inverter circuit composed of P-channel MOS (PMOS) and N-channel MOS (NMOS) transistors 32a and 32b. The source of the PMOS transistor 32a is connected to the power supply PAD 11. The source of the NMOS transistor 32b is connected to the GND-PAD 12. Each gate (input terminal) of PMOS and NMOS transistors 32a and 32b is connected with the output terminal of the CR integrating circuit 31. The output terminal of the trigger circuit 32 in which each drain of PMOS and NMOS transistors 32a and 32b is commonly connected is connected to the thyristor 33.

The PMOS transistor 32a has gate width (W) of 40 μm, gate length (L) of 0.2 μm, gate oxide film thickness (Tox) of 3 nm and threshold voltage (Vth) of −0.4 V. On the other hand, the NMOS transistor 32b has gate width (W) of 20 μm, gate length (L) of 0.2 μm, gate oxide film thickness (Tox) of 3 nm and threshold voltage (Vth) of 0.4 V.

The thyristor 33 is composed of PNP transistor 33a, NPN transistor 33b and resistance element 33c. In the thyristor 33, the output terminal of the trigger circuit 32 is connected with the collector of the PNP transistor 33a, the base of the NPN transistor 33b and one end of the resistance element 33c. The emitter of the PNP transistor 33a is connected to the power supply PAD 11 while the base thereof being connected to the collector of the NPN transistor 33b. The emitter of the NPN transistor 33b and the other end of the resistance element 33c are connected to the GND-PAD 12.

FIG. 11 shows the actual device structure of the thyristor 33. For example, the surface of a P type semiconductor substrate $33_{-1}$ is formed with an N-well region $33_{-2}$. The N-well region $33_{-2}$ has a peak concentration of $3.5 \times 10^{17}$ cm$^{-3}$ and a junction depth (Xj) of 1.5 μm. The surface of the P type semiconductor substrate $33_{-1}$ is further formed with a P-well region $33_{-3}$ adjacent to the N-well region $33_{-2}$. The P-well region $33_{-3}$ has a peak concentration of $6.0 \times 10^{17}$ cm$^{-3}$ and the same depth (Xj=1.5 μm) of impurity concentration as the P type semiconductor substrate $33_{-1}$. In addition, the surface of a P type semiconductor substrate $33_{-1}$ is selectively formed with several isolation insulating regions $33_{-4}$ having STI (Shallow Trench Isolation) structure.

The surface of the N-well region $33_{-2}$ excluding the insulating region $33_{-4}$ is formed with a P$^+$ layer $33_{-5}$ having a peak concentration of $1 \times 10^{20}$ cm$^{-3}$ and a junction depth (Xj) of 0.18 μm. The surface of the P-well region $33_{-3}$ excluding the insulating region $33_{-4}$ is formed with an N$^+$ layer $33_{-6}$ and a P$^+$ layer $33_{-7}$. The N$^+$ layer $33_{-6}$ has a peak concentration of $1 \times 10^{20}$ cm$^{-3}$ and a junction depth (Xj) of 0.18 μm. The P$^+$ layer $33_{-7}$ has a peak concentration of $1 \times 10^{20}$ cm$^{-3}$ and the same depth (Xj=0.18 μm) of impurity concentration as the P type semiconductor substrate $33_{-1}$. The surface of the P type semiconductor substrate $33_{-1}$, that is, the region forming neither N-well nor P-well region $33_{-2}$ and $33_{-3}$ is formed with a P$^+$ layer $33_{-8}$. The P$^+$ layer $33_{-8}$ has a peak concentration of $1 \times 10^{20}$ cm$^{-3}$ and the same depth (Xj=0.18 μm) of impurity concentration as the P type semiconductor substrate $33_{-1}$.

In the thyristor 33, the foregoing P$^+$ layer $33_{-5}$, N-well region $33_{-2}$ and P-well region $33_{-3}$ function as the emitter, base and collector of the PNP transistor 33a shown in FIG. 10, respectively. In FIG. 11, Ln denotes the base length of the PNP transistor 33a; in this case, the base length is about 0.4 μm. The P$^+$ layer $33_{-5}$ is connected with the power supply PAD 11.

Likewise, the foregoing N-well region $33_{-2}$, P-well region $33_{-3}$ and N+ layer $33_{-6}$ function as the collector, base and emitter of the NPN transistor 33b shown in FIG. 10, respectively. In FIG. 11, Lp denotes the base length of the NPN transistor 33b; in this case, the base length is about 0.4 μm. The N+ layer $33_{-6}$ is connected with the GND-PAD 12 while being connected to the P+ layer $33_{-7}$ and the output terminal of the trigger circuit 32 via a 5 KΩ N-well resistor equivalent to the resistance element 33c shown in FIG. 10.

As is evident from FIG. 11, the P+ layer $33_{-7}$ is connected to the P+ layer $33_{-8}$ connected to the GND-PAD 12 via the P-well region $33_{-3}$ and the P type semiconductor substrate $33_{-1}$. However, the resistance value of the P type semiconductor substrate $33_{-1}$ occupying most of the connection resistance has large variations depending on the manufacture process. In order to stabilize the resistance value of the P type semiconductor substrate $33_{-1}$, the resistance element 33c is arranged. High concentration diffusion layers, that is, P+ layer $33_{-5}$, P+ layer $33_{-7}$, P+ layer $33_{-8}$ and N+ layer $33_{-6}$ have the width of about 1 μm and the length (the depth dimension in paper) of about 80 μm.

As seen from FIG. 10, the thyristor 33 has two current paths. More specifically, the thyristor 33 has a first path from the base of the PNP transistor 33a to the collector of the NPN transistor 33b, and a second path from the collector of the PNP transistor 33a to the base of the NPN transistor 33b. In fact, the first and second paths are one path ranging from the N-well region $33_{-2}$ to the P-well region $33_{-3}$. For this reason, it is impossible to insert elements to either of the first and second paths.

The operation of the ESD protection circuit 30 having the foregoing configuration will be explained below with reference to FIG. 10. First, the operation (protection operation) when ESD surge voltage is applied will be described. For example, a positive ESD surge voltage is applied between the power supply PAD 11 and the GND-PAD 12. Whereupon the trigger circuit 32 and the thyristor 33 are in an operating state by the voltage (Vdd) supplied from the power supply PAD 11. In addition, the output (intermediate node) CR integrating circuit 31 is held to GND potential (0 V) by the function of the capacitor element 31b. By doing so, the PMOS transistor 32a of the trigger circuit 32 is in a conductive state. Therefore, the current from the power supply PAD 11 flows through the base-emitter junction of the NPN transistor 33b of the thyristor 33. As a result, the NPN transistor 33b becomes-on state. In other words, a collector current flows through the NPN transistor 33b.

By the collector current, current flows through the base of the PNP transistor 33a, and thereby, the PNP transistor 33a becomes on state. The collector current of the PNP transistor 33a supplies base current of the NPN transistor 33b. Thus, positive feedback loop is formed. As a result, since the thyristor 33 causes snap back, the ESD protection circuit 30 becomes low impedance state capable of carrying large current from the power supply PAD 11 toward the GND-PAD 12. Therefore, the ESD surge current is discharged without stepping up the voltage from the power supply PAD 11. Consequently, there is no possibility that the semiconductor integrated circuit 20 is broken by the ESD surge current.

The normal operation (non-protection operation) of the ESD protection circuit 30 will be explained below. In a state that the voltage (Vdd) from the power supply PAD 11 has no change, the intermediate node of the CR integrating circuit 31 has voltage Vdd by the function of the resistance element 31a. Thus, the output of the trigger circuit 32 is GND potential (0 V); therefore, the NPN transistor 33b becomes off state. In this case, no base current of the PNP transistor 33a is supplied; therefore, no current flows through the PNP transistor 33a. In other words, the thyristor 33 is intactly in the cut-off state.

FIG. 12 is a graph showing the I-V characteristics of the large current region of the conventional ESD protection circuit 30. The ordinate Iesd is the maximum current value of the ESD surge current carried from the power supply PAD 11.

The ESD protection circuit 30 protects the semiconductor integrated circuit 20 from the breakdown by electrostatic discharge. In other words, this means preventing the gate oxide film of MOS integrated circuit from being broken down by the ESD surge current. In order to perform the foregoing protection, the following conditions are given. The current I from the power supply PAD 11 is set within a range smaller than the maximum current value Iesd, and the voltage V does not exceed the oxide film breakdown voltage BVox (Vclamp<BVox). In order to prevent the thyristor 33 from latching up by well induction in the normal operation, the voltage minimum value Vh after snap back must be set larger than the maximum guaranteed power-supply voltage Vddmax (normally, 1.1*Vdd) (Vh>Vddmax). Therefore, an on-resistance (required resistance value) Ron the thyristor 33 must have in conductive state after snap back is given:

$$Ron=(Vclamp-Vh)/(Iesd-Ih)$$

where, Ih is current at the point (Vh) where voltage is minimal after snap back. In general, Iesd>>Ih; thus, the following equation (1) is obtained.

$$Ron \approx (Vclamp-Vh)/Iesd \qquad (1)$$

In addition, the following relations are given.

$$Vclamp<BVox \qquad (2)$$

$$Vh>Vddmax \qquad (3)$$

From the foregoing equations (1), (2) and (3), the following equation is obtained.

$$Ron<(BVox-Vddmax)/Iesd$$

For simplification, man-machine model such that the maximum current value Iesd is 2.7 A is given as one example. In micro CMOS devices having an oxide film thickness of about 12 angstroms, the oxide film breakdown voltage BVox is about 4 V.

That is, if Vddmax is equal to 1.2 V, the required resistance value is as follows.

$$Ron<(4\ V-1.2\ V)/2.7\ A=1.0\ \Omega$$

In order to realize the required resistance value, the device width (high concentration diffusion layer length) shown in FIG. 11 requires 80 μm in the conventional ESD protection circuit 30. As a result, the circuit has a huge size.

With the scale-down of MOS integrated circuits, the power supply voltage is set low, and the oxide film thickness is thinned. On the other hand, the required resistance value (Ron) is reduced with thinning of the gate oxide film. In order to realize a predetermined required resistance value (Ron), the ESD protection circuit 30 must be formed into a huge size more and more.

In addition, the interconnect resistances R1 and R2 are interposed between the semiconductor integrated circuit 20 and the ESD protection circuit 30, as illustrated in FIG. 9. In this case, both terminals of the semiconductor integrated circuit 20 further steps up.

The condition for protecting the oxide film in the foregoing case is as follows.

$$V\text{clamp}+I\text{esd}*(R1+R2)<BVox$$

In other words, the following equation (4) is given.

$$V\text{clamp}<BVox-I\text{esd}*(R1+R2) \qquad (4)$$

In this case, the following equation is given.

$$Ron+R1+R2<(BVox-Vdd\text{max})/I\text{esd}$$

Considering interconnect resistances R1 and R2, the required resistance value (Ron) must be made further small; for this reason, the ESD protection circuit 30 is formed into a huge size more and more. Otherwise, many ESD protection circuit 30 must be interposed between the power supply PAD 11 and the GND-PAD 12 in order to make small the value of the interconnect resistances R1 and R2.

As described above, the gate oxide film must be thinned, and the required resistance value (Ron) must be made small in accordance with the interconnect resistances in the conventional case. For this reason, there is a problem that the ESD protection circuit is formed into a huge size.

BRIEF SUMMARY OF THE INVENTION

According to a first aspect of the present invention, there is provided a semiconductor device including a protection circuit protecting a semiconductor integrated circuit from electrostatic discharge, the protection circuit comprising: a detection circuit detecting the electrostatic discharge; a trigger circuit generating a trigger signal based on the output signal of the detection circuit; a thyristor having a PNP transistor and an NPN transistor, and operating by the trigger signal from the trigger circuit, the PNP transistor having an emitter connected to a first terminal of the semiconductor device, the NPN transistor having an emitter connected to a second terminal of the semiconductor device and a collector connected to base of the PNP transistor; and a switching element controlling the connected between the PNP and NPN transistors in accordance with the output signal of the detection circuit.

According to a second aspect of the present invention, there is provided a semiconductor device comprising: a detection circuit connected between first and second terminals; a trigger circuit connected between the first and second terminals, and generating a trigger signal in accordance with an output signal of the detection circuit; a thyristor control circuit generating a thyristor control signal in accordance with the output signal of the detection circuit; and a thyristor connected between the first and second terminals so that the operation can be controlled based on the trigger signal and the thyristor control signal.

According to a third aspect of the present invention, there is provided a semiconductor device comprising: a semiconductor integrated circuit connected between first and second terminals; a detection circuit connected between the first and second terminals; a trigger circuit connected between the first and second terminals, and generating a trigger signal in accordance with an output signal of the detection circuit; a thyristor control circuit generating a thyristor control signal in accordance with the output signal of the detection circuit; a thyristor connected between the first and second terminals so that the operation can be controlled based on the trigger signal and the thyristor control signal; and a protection diode connected between the first and second terminals.

BRIEF DESCRIPTION OF THE SEVERAL VIEWS OF THE DRAWING

FIG. 5 is a cross-section view showing still another device structure of the thyristor included in the ESD protection circuit shown in FIG. 1;

DETAILED DESCRIPTION OF THE INVENTION

Embodiments of the present invention will be described below with reference to the accompanying drawings.

[First Embodiment]

Figure 1:
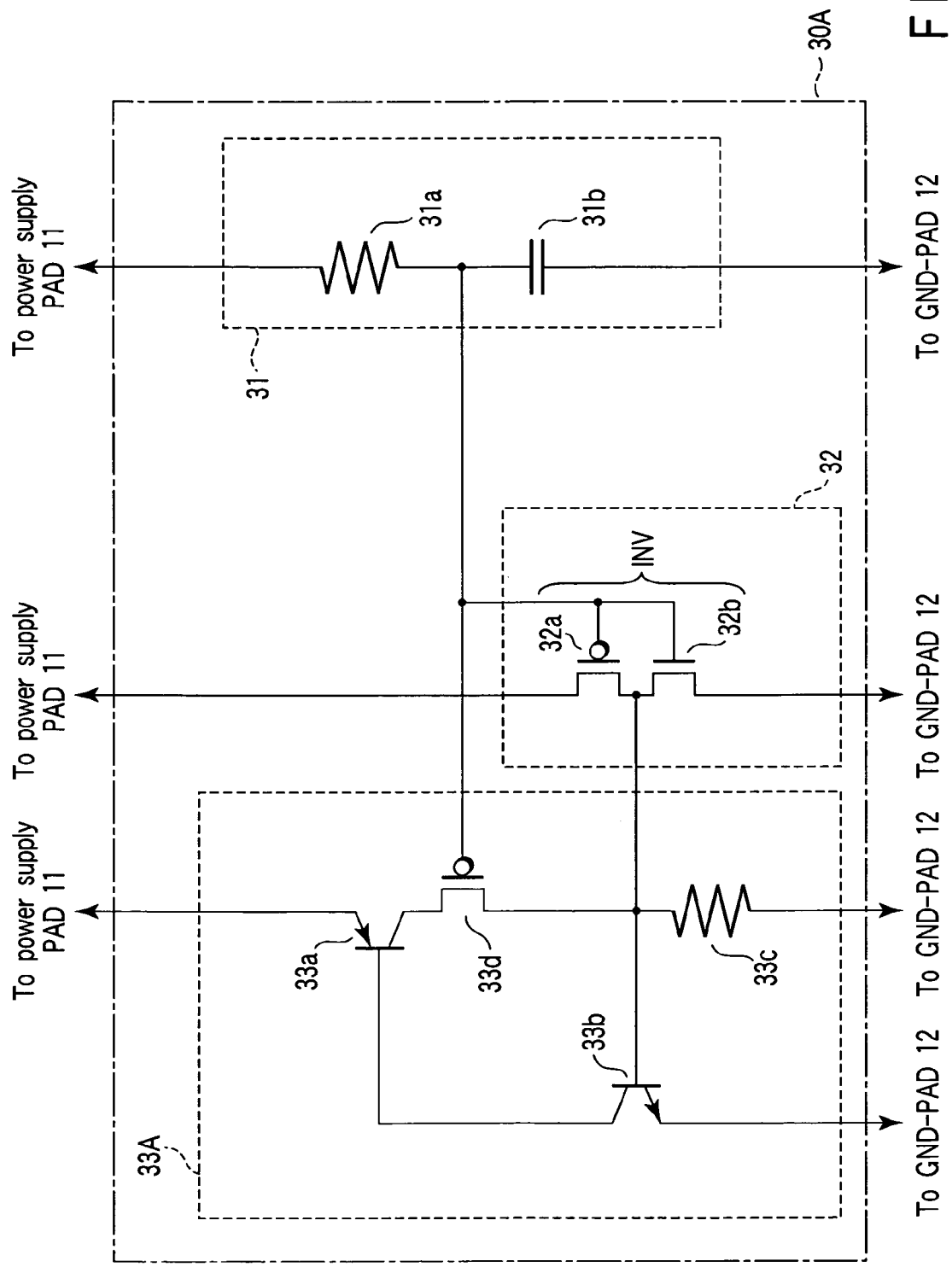
FIG. 1 is a circuit diagram showing the configuration of an ESD protection circuit according to a first embodiment of the present invention.
Figure 10:
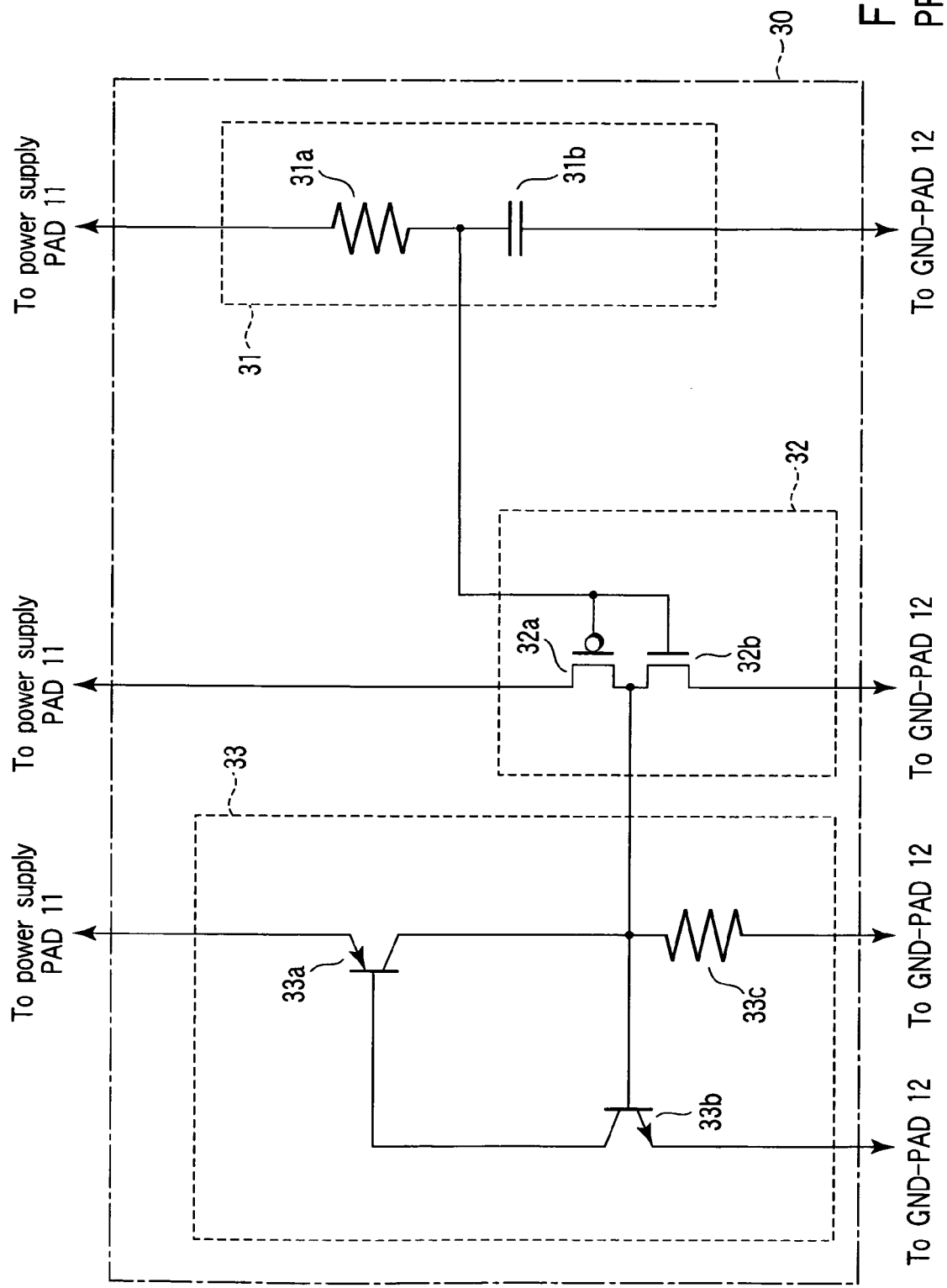
FIG. 10 is a circuit diagram showing the configuration of a conventional ESD protection circuit.
Figure 11:
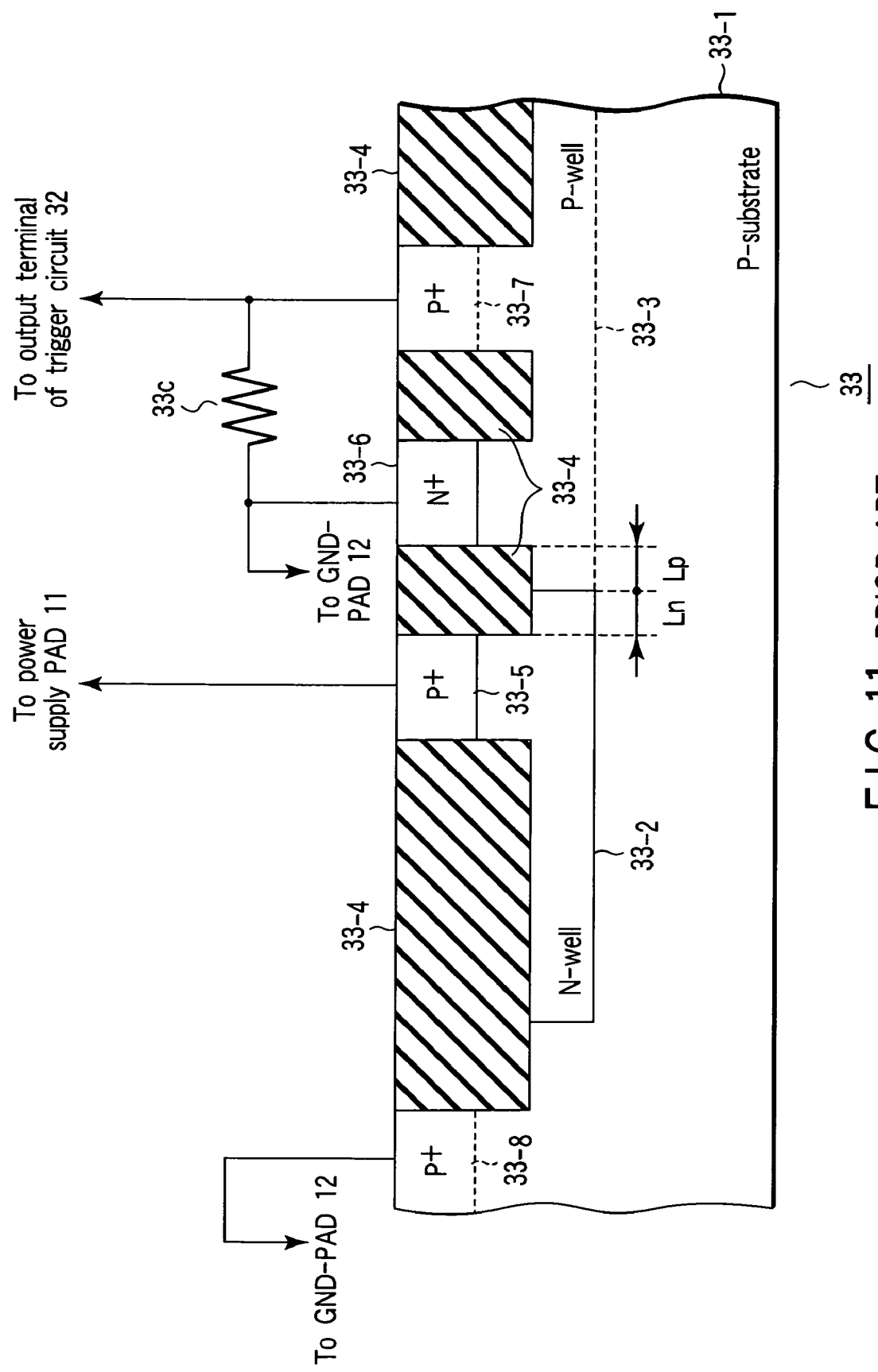
FIG. 11 is a cross-section view showing the device structure of a thyristor included in the conventional ESD protection circuit shown in FIG. 10.

FIG. 1 is a circuit diagram showing the configuration of an ESD (Electrostatic Discharge) protection circuit according to a first embodiment of the present invention. Here, an AC trigger break-type thyristor is given as one example. The thyristor is used as a protection circuit, which is integrated on the same substrate together with the protection target, that is, a semiconductor integrated circuit to protect the gate oxide film of MOS integrated circuit. Incidentally, the same reference numerals are used to designate parts identical to FIG. 10, and the detailed explanation is omitted.

According to the first embodiment, a PMOS transistor 33d controlled by the output of a CR integrating circuit 31 electrically breaks a first current path in the normal operation, as shown in FIG. 1. The first current path connects the collector of a PNP transistor 33a and the base of an NPN transistor 33b in a thyristor 33A.

Figure 9:
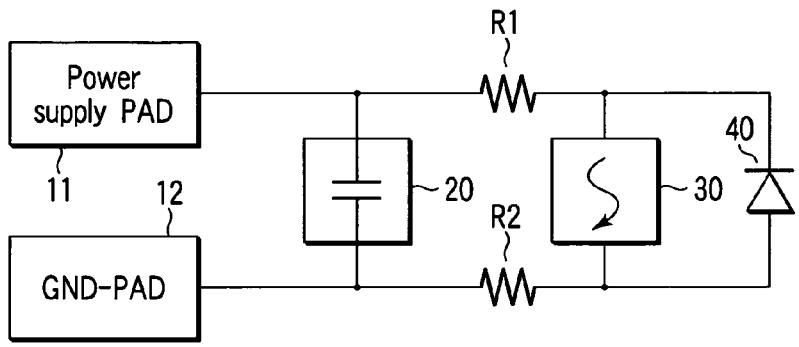
FIG. 9 is a view showing the basic configuration of an integrated circuit device in order to the conventional technique and the problem.
Figure 12:
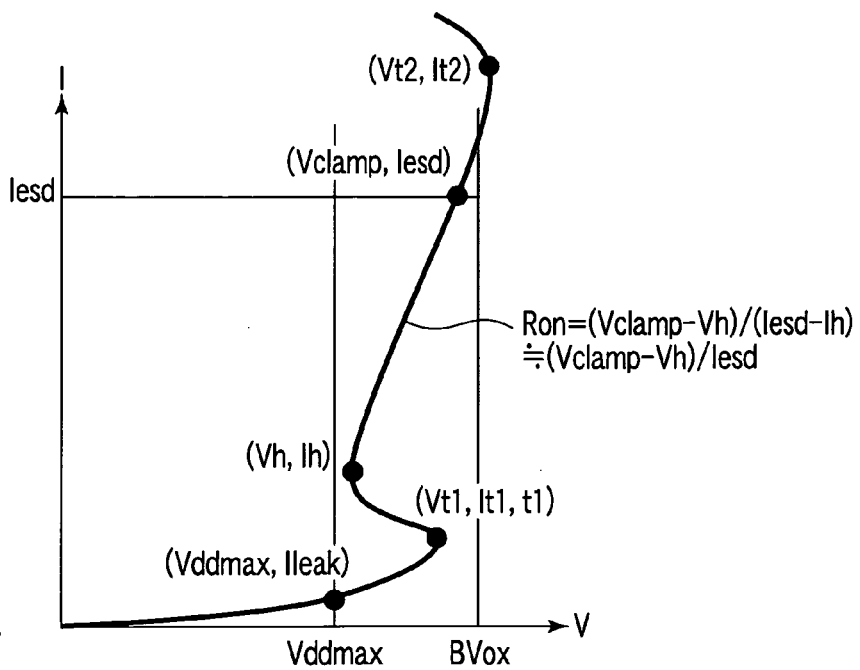
FIG. 12 is a graph showing the I-V characteristics of a large current region of the conventional ESD protection circuit shown in FIG. 10.

An ESD protection circuit 30A is interposed between the power supply PAD (first terminal) 11 and the GND-PAD (second terminal) 12, as shown in FIG. 9, and connected in parallel with the semiconductor integrated circuit 20. As seen from FIG. 1, the ESD protection circuit 30A is composed of CR integrating circuit (detection circuit) 31, trigger circuit 32 and thyristor 33A.

The CR integrating circuit 31 has the configuration that a resistance element (R) 31a and a capacitor element (C) 31b are connected in series between the power supply PAD 11 and the GND-PAD 12. The resistance element 31a is an N-well resistor having a resistance value of 1 MΩ, which is formed on a P type semiconductor substrate ($33_{-11}$). The capacitor element 31b is a MOS (Metal Oxide Semiconductor) capacitor having a capacitance value of 6 pF. The contact between two elements 31a and 31b, that is, an output terminal (intermediate terminal) of the CR integrating circuit 31 is connected to an input terminal of the trigger circuit 32 and a switching element described later.

The trigger circuit 32 comprises a CMOS (Complementary MOS) structure inverter circuit INV composed of P-channel MOS (PMOS) and N-channel MOS (NMOS) transistors 32a and 32b. Each electrode of the inverter circuit INV, that is, the source of PMOS transistor 32a and the source of NMOS transistor 32b are connected to the power supply PAD 11 and the GND-PAD 12, respectively. Each gate (input terminal) of PMOS and NMOS transistors 32a and 32b is connected with the output terminal of the CR integrating circuit 31. The output terminal of the trigger circuit 32 in which each drain of PMOS and NMOS transistors 32a and 32b is commonly connected is connected to the thyristor 33A.

The thyristor 33A is composed of PNP transistor 33a, NPN transistor 33b, resistance element 33c and PMOS transistor 33d functioning as the switching element. The emitter of the PNP transistor 33a is connected to the power supply PAD 11 while the base thereof being connected to the collector of the NPN transistor 33b (second connection wiring). The collector of the PNP transistor 33a is connected to the source of the PMOS transistor 33d. The gate of the PMOS transistor 33d is connected with the output terminal of the CR integrating circuit 31. The drain of the PMOS transistor 33d, the base of the NPN transistor 33b and one end of the resistance element 33c are connected with the output terminal of the trigger circuit 32. The emitter of the NPN transistor 33b and the other end of the resistance element 33c are connected to the GND-PAD 12.

In other words, the PMOS transistor 33d is inserted in a first connection wiring (first current path) connecting the collector of a PNP transistor 33a and the base of an NPN transistor 33b in the thyristor 33A. The PMOS transistor 33d has gate width (W) of 80 μm, gate length (L) of 0.15 μm, gate oxide film thickness (Tox) of 2 nm and threshold voltage (Vth) of –0.2 V.

Figure 2:
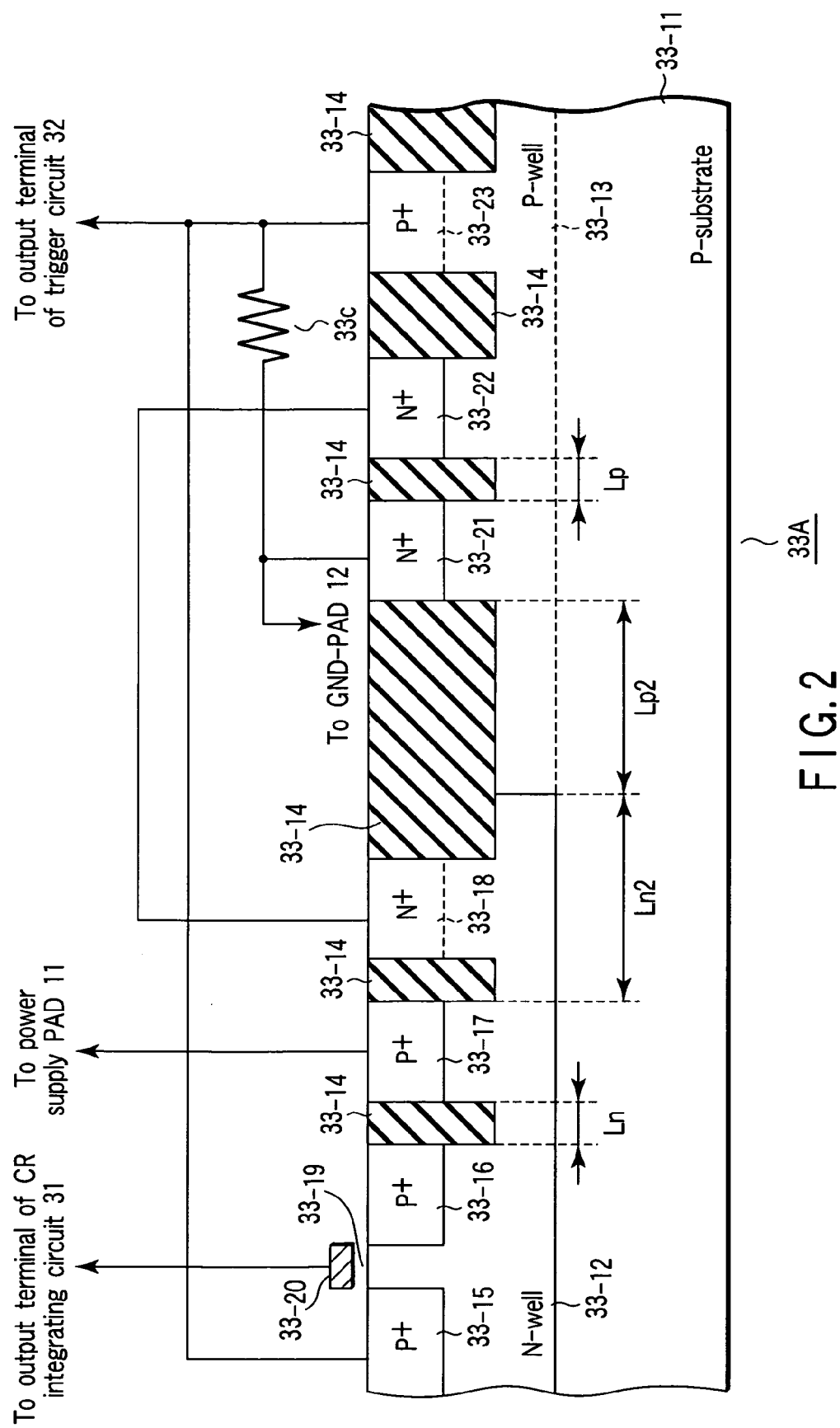
FIG. 2 is a cross-section view showing the device structure of a thyristor included in the ESD protection circuit shown in FIG. 1.

FIG. 2 shows the actual device structure of the thyristor 33A shown in FIG. 1. For example, the surface of a P type semiconductor substrate $33_{-11}$ is formed with an N-well region $33_{-12}$. The N-well region $33_{-12}$ has a peak concentration of $3.5 \times 10^{17}$ cm$^{-3}$ and a junction depth (Xj) of 1.5 μm. The surface of the P type semiconductor substrate $33_{-11}$ is further formed with a P-well region $33_{-13}$ adjacent to the N-well region $33_{-12}$. The P-well region $33_{-13}$ has a peak concentration of $6.0 \times 10^{17}$ cm$^{-3}$ and the same depth (Xj=1.5 μm) of impurity concentration as the P type semiconductor substrate $33_{-11}$. In addition, the surface of a P type semiconductor substrate $33_{-11}$ is selectively formed with several isolation insulating regions $33_{-14}$ having STI (Shallow Trench Isolation) structure.

The surface of the N-well region $33_{-12}$ excluding the insulating region $33_{-14}$ is formed with P$^+$ layers $33_{-15}$, $33_{-16}$, $33_{-17}$, and N$^+$ layer $33_{-18}$ with approximately regular intervals. The foregoing P$^+$ layers $33_{-15}$ to $33_{-17}$ have a peak concentration of $1 \times 10^{20}$ cm$^{-3}$ and a junction depth (Xj) of 0.18 μm. The N$^+$ layer $33_{-18}$ has a peak concentration of $1 \times 10^{20}$ cm$^{-3}$ and the same depth (Xj=0.18 μm) of impurity concentration as the P type semiconductor substrate $33_{-11}$. The insulating region $33_{-14}$ is arranged in mutually each space among P$^+$ layer $33_{-16}$, P$^+$ layer $33_{-17}$ and N$^+$ layer $33_{-18}$, exclusive of the space between P$^+$ layers $33_{-15}$ and $33_{-16}$. The surface of the N-well region $33_{-12}$ corresponding to the space between P$^+$ layers $33_{-15}$ and $33_{-16}$ is formed with a P-type polysilicon gate electrode $33_{-20}$. In this case, the P-type polysilicon gate electrode $33_{-20}$ is formed via a gate oxide film (thermal oxide film) $33_{-19}$ having a thickness of about 20 angstroms.

On the other hand, the surface of the P-well region $33_{-13}$ excluding the insulating region $33_{-14}$ is formed with N$^+$ layers $33_{-21}$, $33_{-22}$ and a P$^+$ layer $33_{-23}$. The N$^+$ layers $33_{-21}$ and $33_{-22}$ individually have a peak concentration of $1 \times 10^{20}$ cm$^{-3}$ and a junction depth (Xj) of 0.18 μm. The P$^+$ layer $33_{-23}$ has a peak concentration of $1 \times 10^{20}$ cm$^{-3}$ and the same depth (Xj=0.18 μm) of impurity concentration as the P type semiconductor substrate $33_{-11}$. The insulating region $33_{-14}$ is formed in each space among N$^+$ layers $33_{-18}$, $33_{-21}$, $33_{-22}$ and P$^+$ layer $33_{-23}$.

In the thyristor 33A, the foregoing P$^+$ layers $33_{-15}$, $33_{-16}$ and gate electrode $33_{-20}$ function as the drain, source and gate of the PMOS transistor 33d shown in FIG. 1, respectively. The drain of the PMOS transistor 33d, that is, the P$^+$ layer $33_{-15}$ is connected to the output terminal of the trigger circuit 32. The gate of the PMOS transistor 33d, that is, the gate electrode $33_{-20}$ is connected to the output terminal of the CR integrating circuit 31. The foregoing P$^+$ layer $33_{-16}$, N-well region $33_{-12}$ and P$^+$ layer $33_{-17}$ function as the collector, base and emitter of the PNP transistor 33a shown in FIG. 1, respectively. In FIG. 1, Ln denotes the base length of the PNP transistor 33a; in this case, the base length is about 0.2 μm. The P$^+$ layer $33_{-17}$ is connected with the power supply PAD 11. The N$^+$ layer $33_{-18}$ is used to take a base current from the N-well region $33_{-12}$, and connected to the N$^+$ layer $33_{-22}$.

Likewise, the foregoing N$^+$ layer $33_{-21}$, P-well region $33_{-13}$ and N$^+$ layer $33_{-22}$ function as the emitter, base and collector of the NPN transistor 33b shown in FIG. 1, respectively. In FIG. 1, Lp denotes the base length of the NPN transistor 33b; in this case, the base length is about 0.2 μm. The N$^+$ layer $33_{-21}$ is connected with the GND-PAD 12. Further, the N$^+$ layer $33_{-21}$ is connected to the P$^+$ layer $33_{-23}$ for taking a base current from the P-well region $33_{-13}$ and to the output terminal of the trigger circuit 32 via a 5 KΩ N-well resistor equivalent to the resistance element 33c shown in FIG. 1.

The region of the P type semiconductor substrate $33_{-11}$ forming neither N-well region $33_{-12}$ nor P-well region $33_{-13}$ is formed with a P$^+$ layer (not shown). The P$^+$ layer is connected to the GND-PAD 12. The thyristor 33A is designed to satisfy the relation of Ln<<Ln2, Lp<<Lp2 in order to prevent parasitic thyristor operation. High concentration diffusion layers, that is, P$^+$ layers $33_{-15}$, $33_{-16}$, $33_{-17}$, $33_{-23}$, N$^+$ layers $33_{-18}$, $33_{-21}$ and N$^+$ layer $33_{-22}$ have the width of about 1 μm and the length (the depth dimension in paper) of about 55 μm.

As is evident from FIG. 1, the thyristor 33A has first and second paths (first and second connection wirings). The first path (first connection wiring) ranges from the collector of the PNP transistor 33a to the base of the NPN transistor 33b. The second path (second connection wiring) ranges from the base of the PNP transistor 33a to the collector of the NPN transistor 33b. The PMOS transistor 33d functioning as the switching element is inserted in the first path. In general, the NPN transistor can realize HFE (forward current amplification factor of bipolar transistor) larger than the PNP transistor. Thus, the switching element is inserted in the first path, and thereby, the amount of current in the power-on time of the thyristor is reduced. In other words, on-off control of the first path is carried out using a small switching element; therefore, it is advantageous.

The operation of the ESD protection circuit 30A having the foregoing configuration will be explained below with reference to FIG. 1. First, the operation (protection operation) when ESD surge voltage is applied will be described. For example, a positive ESD surge voltage is applied between the power supply PAD 11 and the GND-PAD 12. Whereupon the trigger circuit 32 and the thyristor 33A are in an operating state by the voltage (Vdd) supplied from the power supply PAD 11. In addition, the output (intermediate node) CR integrating circuit 31 is held to GND potential (0 V) by the function of the capacitor element 31b. By doing so, the gate voltage of the PMOS transistor 33d becomes GND potential; therefore, the PMOS transistor 33d powers on. As a result, positive feedback loop is formed according to the mechanism as the conventional case.

More specifically, the PMOS transistor 32a of the trigger circuit 32 is in a conductive state. Therefore, a current from the GND-PAD 12 flows through the base-emitter junction of the NPN transistor 33b of the thyristor 33A. As a result, the NPN transistor 33b becomes on state. In other words, a collector current flows through the NPN transistor 33b. By the collector current, current flows through the base of the PNP transistor 33a, and thereby, the PNP transistor 33a becomes on state. The collector current of the PNP transistor 33a supplies base current of the NPN transistor 33b. Thus, positive feedback loop is formed. As a result, since the thyristor 33A causes snap back, the ESD protection circuit 30 becomes low impedance state capable of carrying large current from the power supply PAD 11 toward the GND-PAD 12. Therefore, the ESD surge current is discharged without stepping up the voltage (Vdd) from the power supply PAD 11. Consequently, there is no possibility that the semiconductor integrated circuit 20 is broken.

The normal operation (non-protection operation) of the ESD protection circuit 30A will be explained below. In a state that the voltage (Vdd) from the power supply PAD 11 has no change, the intermediate node of the CR integrating circuit 31 has Vdd potential by the function of the resistance element 31a. Thus, the output of the trigger circuit 32 becomes GND potential (0 V); therefore, the NPN transistor 33b becomes off state. In this case, no base current of the PNP transistor 33a is supplied; therefore, no current flows through the PNP transistor 33a. In addition, the PMOS transistor 33d is in off state, so that feedback loop for causing snap back can be broken. In other words, the thyristor 33A is in the cut-off state.

Figure 3:
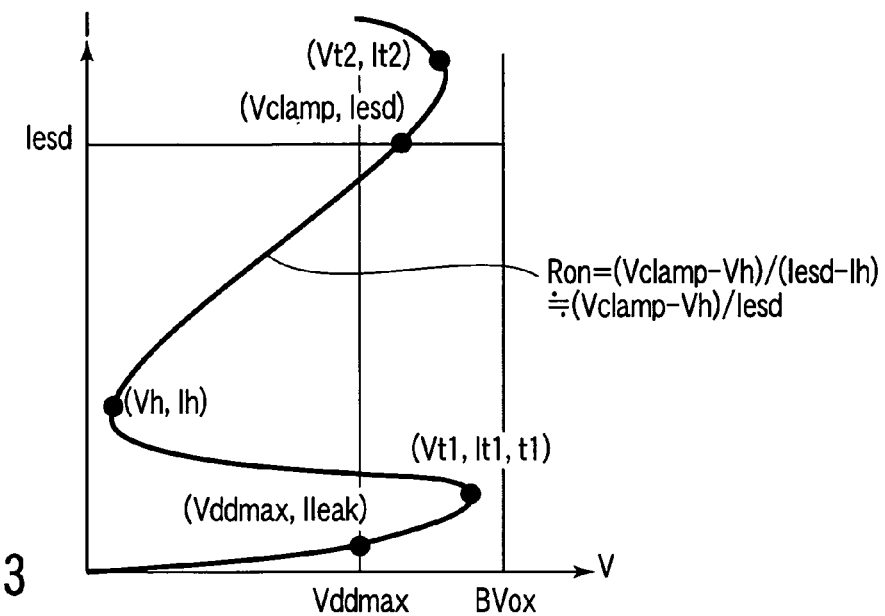
FIG. 3 is a graph showing the I-V characteristics of a large current region of the ESD protection circuit shown in FIG. 1.

FIG. 3 is a graph showing the I-V characteristics of a large current region of the ESD protection circuit 30A having the configuration described above. The ESD protection circuit 30A prevents the breakdown of the semiconductor integrated circuit 20; in this case, the following conditions are given. That is, the current I from the power supply PAD 11 is set within a range smaller than the maximum current value Iesd of the ESD surge current, and the voltage V does not exceed the oxide film breakdown voltage BVox (Vclamp<BVox). The conditions are the same as the conventional case.

The PMOS transistor 33d remains off in normal operating state (non-ESD state) because its gate is connected to the power supply PAD 11 by the resistance element 31a. Thus, the thyristor 33A is not continuously on (not latched up) even if noise enters its well region while it is operating in normal state to increase a well potential. Hence, the voltage minimum value Vh after snap back need not be greater than the maximum guaranteed power-supply voltage Vddmax (Vh>Vddmax). Therefore, the on-resistance Ron the thyristor 33A must have in conductive state after snap back is given:

$$Ron=(Vclamp-Vh)/(Iesd-Ih)$$

where, Ih is current at the point (Vh) where voltage is minimal after snap back. In general, Iesd>>Ih; thus, the following equation (1) is obtained.

$$Ron \approx (Vclamp-Vh)/Iesd \quad (1)$$

In addition, the following relation is given.

$$Vclamp<BVox \quad (2)$$

From the foregoing equations (1) and (2), the following equation is obtained.

$$Ron<(BVox-Vh)/Iesd$$

The base lengths Ln and Lp are set smaller, that is, to 0.2 µm. Thus, this serves to sufficiently improve the HFE of PNP and NPN transistors 33a and 33b. As a result, the voltage minimum value Vh after snap back becomes 0.4 V; therefore, the value is a numerical value disregarding the oxide film breakdown voltage BVox.

The on-resistance Ron in the conductive state after snap back is expressed by the following equation.

$$Ron \approx BVox/Iesd$$

If the maximum current value Iesd of the ESD surge current is set as 2.7 A and the oxide film breakdown voltage BVox is set as 4 V, the on-resistance Ron is give by the following equation.

$$Ron<4 \text{ V}/2.7 \text{ A}=1.5 \text{ }\Omega$$

By doing so, the device width is 55 µm, that is, reduced to about ⅟₁.₅ of the conventional case. The effect is further improved considering power supply and ground interconnect resistances R1 and R2 shown in FIG. 9. For example, if the device width is set to the same 80 µm as the conventional case, the resistance value allowable to the foregoing interconnect resistances R1 and R2 is 0.5 Ω larger than the conventional case. As a result, it is possible to greatly reduce the necessary number of inserting several ESD protection circuits 30A.

Figure 4:
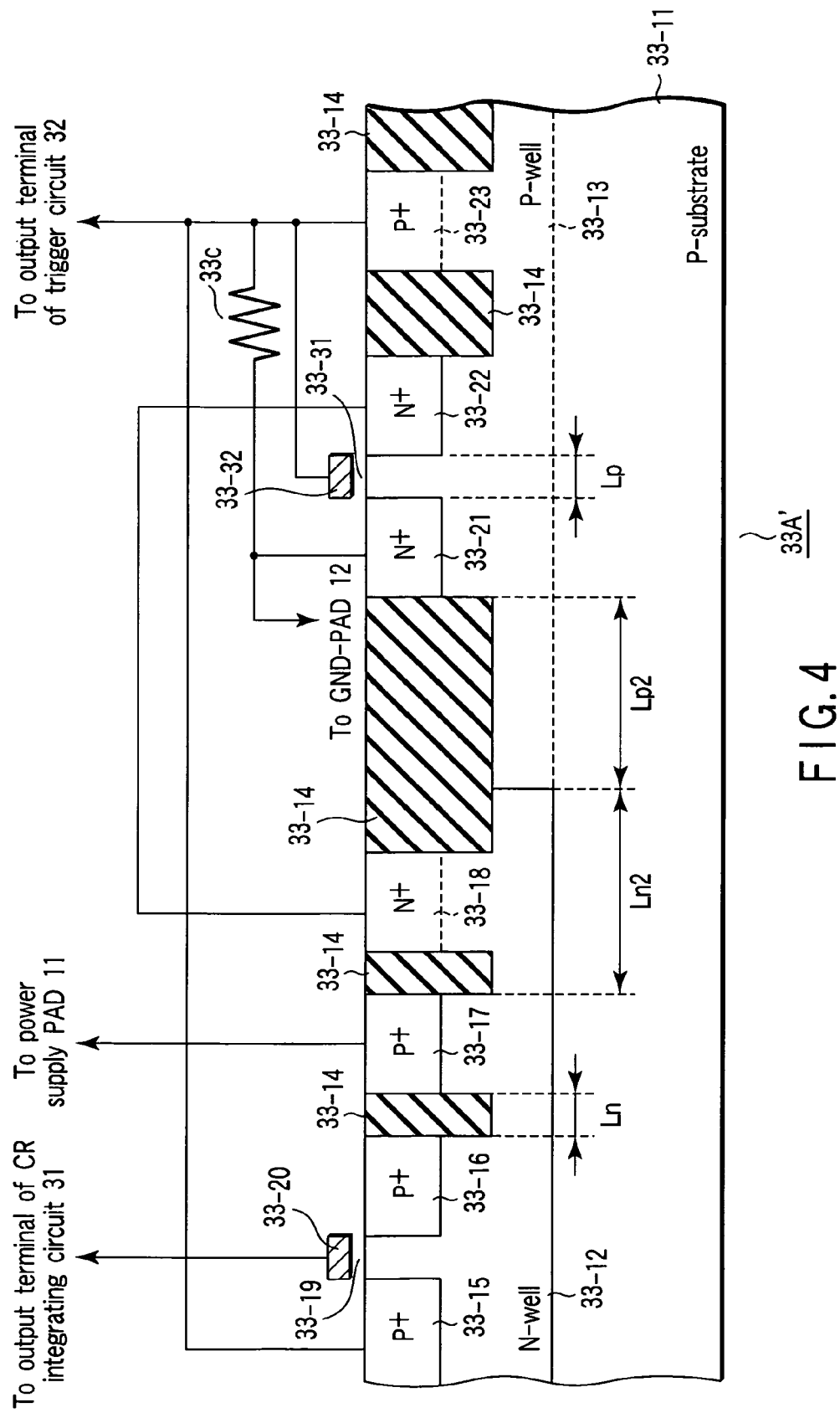
FIG. 4 is a cross-section view showing another device structure of the thyristor included in the ESD protection circuit shown in FIG. 1.

FIG. 4 shows another device structure of the thyristor 33A shown in FIG. 1. The same reference numerals are used to designate portions identical to FIG. 2, and the detailed explanation is omitted. Here, the insulating region between N⁺ layers $33_{-21}$ and $33_{-22}$ is not provided to form a MOS transistor structure.

In a thyristor 33A' has the structure described above, the surface of the P-well region $33_{-13}$ corresponding to the space between N⁺ layers $33_{-21}$ and $33_{-22}$ is formed with an N⁺ type polysilicon gate electrode $33_{-32}$. In this case, the N⁺ type polysilicon gate electrode $33_{-32}$ is formed via a gate oxide film (thermal oxide film) $33_{-31}$ having a thickness of about 20 angstroms. The gate electrode $33_{-32}$, that is, polysilicon is connected with the P⁺ layer $33_{-23}$ connected to bulk, that is, the P-well region $33_{-13}$, and thereby, the NPN transistor 33b is formed.

In general, it is advantageous to micro-fabricate polysilicon rather than STI; therefore, the base length Lp is made smaller. As described above, the base length Lp is made smaller, and thereby, the voltage minimum value Vh after snap back can be reduced. Thus, according to the foregoing structure, the device width can be further reduced as compared with the structure shown in FIG. 2.

FIG. 5 shows still another device structure of the thyristor 33A shown in FIG. 1. The same reference numerals are used to designate portions identical to FIG. 2, and the detailed explanation is omitted. Here, the NPN transistor 33b has a vertical type transistor structure.

More specifically, a thyristor 33A" has the following structure. For example, the surface of a P type semiconductor substrate $33_{-11}$ is formed with N-well regions $33_{-12}$ and $33_{-41}$ adjacent to each other. The N-well region $33_{-12}$ has a peak concentration of $3.5 \times 10^{17}$ $cm^{-3}$ and a junction depth (Xj) of 1.5 μm. The N-well region $33_{-41}$ has a peak concentration of $2.0 \times 10^{17}$ $cm^{-3}$ and a junction depth (Xj) of 1.9 μm. The deeper N-well region $33_{-41}$ is formed with a P-well region $33_{-13}$. The P-well region $33_{-13}$ has a peak concentration of $6.0 \times 10^{17}$ $cm^{-3}$ and the same depth (Xj=1.5 μm) of impurity concentration as the P type semiconductor substrate $33_{-11}$. In addition, the surface of the P type semiconductor substrate $33_{-11}$ is selectively formed with several isolation insulating regions $33_{-14}$ having STI (Shallow Trench Isolation) structure.

The surface of the N-well region $33_{-12}$ excluding the insulating region $33_{-14}$ is formed with P$^+$ layers $33_{-15}$, $33_{-16}$ and $33_{-17}$ with approximately regular intervals. The foregoing P$^+$ layers $33_{-15}$ to $33_{-17}$ have a peak concentration of $1 \times 10^{20}$ $cm^{-3}$ and the same depth (Xj=0.18 μm) of impurity concentration as the P type semiconductor substrate $33_{-11}$. The insulating region $33_{-14}$ is arranged in the space between P$^+$ layer $33_{-16}$ and P$^+$ layer $33_{-17}$. The surface of the N-well region $33_{-12}$ corresponding to the space between P$^+$ layers $33_{-15}$ and $33_{-16}$ is formed with a P-type polysilicon gate electrode $33_{-20}$. In this case, the P-type polysilicon gate electrode $33_{-20}$ is formed via a gate oxide film (thermal oxide film) $33_{-19}$ having a thickness of about 20 angstroms. On the other hand, the surface of the P-well region $33_{-13}$ excluding the insulating region $33_{-14}$ is formed with an N$^+$ layer $33_{-21}$ and a P$^+$ layer $33_{-23}$. The N$^+$ layer $33_{-21}$ has a peak concentration of $1 \times 10^{20}$ $cm^{-3}$ and a junction depth (Xj) of 0.18 μm. The P$^+$ layer $33_{-23}$ has a peak concentration of $1 \times 10^{20}$ $cm^{-3}$ and the same depth (Xj=0.18 μm) of impurity concentration as the P type semiconductor substrate $33_{-11}$.

In the thyristor 33A", the foregoing P$^+$ layer $33_{-15}$, $33_{-16}$ and gate electrode $33_{-20}$ functions as the drain, source and gate of the PMOS transistor 33d shown in FIG. 1, respectively. The drain of the PMOS transistor 33d, that is, the P$^+$ layer $33_{-15}$ is connected to the output terminal of the trigger circuit 32. The gate of the PMOS transistor 33d, that is, the gate electrode $33_{-20}$ is connected to the output terminal of the CR integrating circuit 31. The foregoing P$^+$ layer $33_{-16}$, N-well region $33_{-12}$ and P$^+$ layer $33_{-17}$ function as the collector, base and emitter of the PNP transistor 33a shown in FIG. 1, respectively. In FIG. 5, Ln denotes the base length of the PNP transistor 33a; in this case, the base length is about 0.2 μm. The P$^+$ layer $33_{-17}$ is connected with the power supply PAD 11.

Likewise, the foregoing N$^+$ layer $33_{-21}$, P-well region $33_{-13}$ and deeper N-well region $33_{-41}$ function as the emitter, base and collector of the NPN transistor 33b shown in FIG. 1, respectively. In FIG. 5, Lp denotes the base length of the NPN transistor 33b; in this case, the base length is about 0.2 μm. The N$^+$ layer $33_{-21}$ is connected with the GND-PAD 12.

Further, the N$^+$ layer $33_{-21}$ is connected to the P$^+$ layer $33_{-23}$ for taking a base current from the P-well region $33_{-13}$ and to the output terminal of the trigger circuit 32 via a 5 KΩ N-well resistor equivalent to the resistance element 33c shown in FIG. 1.

The surface of the P type semiconductor substrate $33_{-11}$ forming neither N-well region $33_{-12}$ nor P-well region $33_{-13}$ is formed with a P$^+$ layer (not shown). The P$^+$ layer is connected to the GND-PAD 12. The thyristor 33A" is designed to satisfy at least one of the relations of Ln<Ln2 or Lp<Lp2 in order to prevent parasitic thyristor operation. High concentration diffusion layers, that is, P$^+$ layers $33_{-15}$, $33_{-16}$, $33_{-17}$, $33_{-23}$ and N$^+$ layer $33_{-21}$ have the width of about 1 μm and the length (the depth dimension in paper) of about 40 μm. The 5 KΩ N-well resistor equivalent to the resistance element 33c is provided as the need arises.

As described above, the vertical-structure NPN transistor 33b is employed. By doing so, a current injected from the emitter to the base mainly flows through the deep region of the p type semiconductor substrate $33_{-11}$, that is, the low impurity concentration region. Therefore, re-combination with electron holes can be reduced. In addition, the base length Lp is made small, so that the voltage minimum value Vh after snap back can be reduced. Therefore, the limitation of the required resistance value (Ron) is softened, so that the device width can be further reduced as compared with the structure shown in FIG. 4. In other words, the connection between the base of the PNP transistor 33a and the collector of the NPN transistor 33b is realized using the connection between wells. As a result, the area of the ESD protection circuit can be further made small.

As described above, the PMOS transistor 33d is inserted on the way of the first current path ranging from the collector of the PNP transistor 33a to the base of the NPN transistor 33b. The PMOS transistor 33d electrically breaks the first current path in the normal operation. In other words, the thyristor cuts off feedback loop for latching up in the normal operation. By doing so, there is no need of considering the limitation that the voltage minimum value Vh after snap back must be set larger than the maximum guaranteed power supply voltage Vddmax (Vh>Vddmax). As a result, it is possible to soften the design limitation to the ESD protection circuit, and to reduce the device width and the number of the ESD protection circuits inserted between terminals. Therefore, the required resistance value is sufficiently softened in accordance with gate oxide film thinning and the interconnect resistance. Consequently, it is possible to reduce the area of the ESD protection circuit occupied in the integrated circuit device.

[Second Embodiment]

Figure 6:
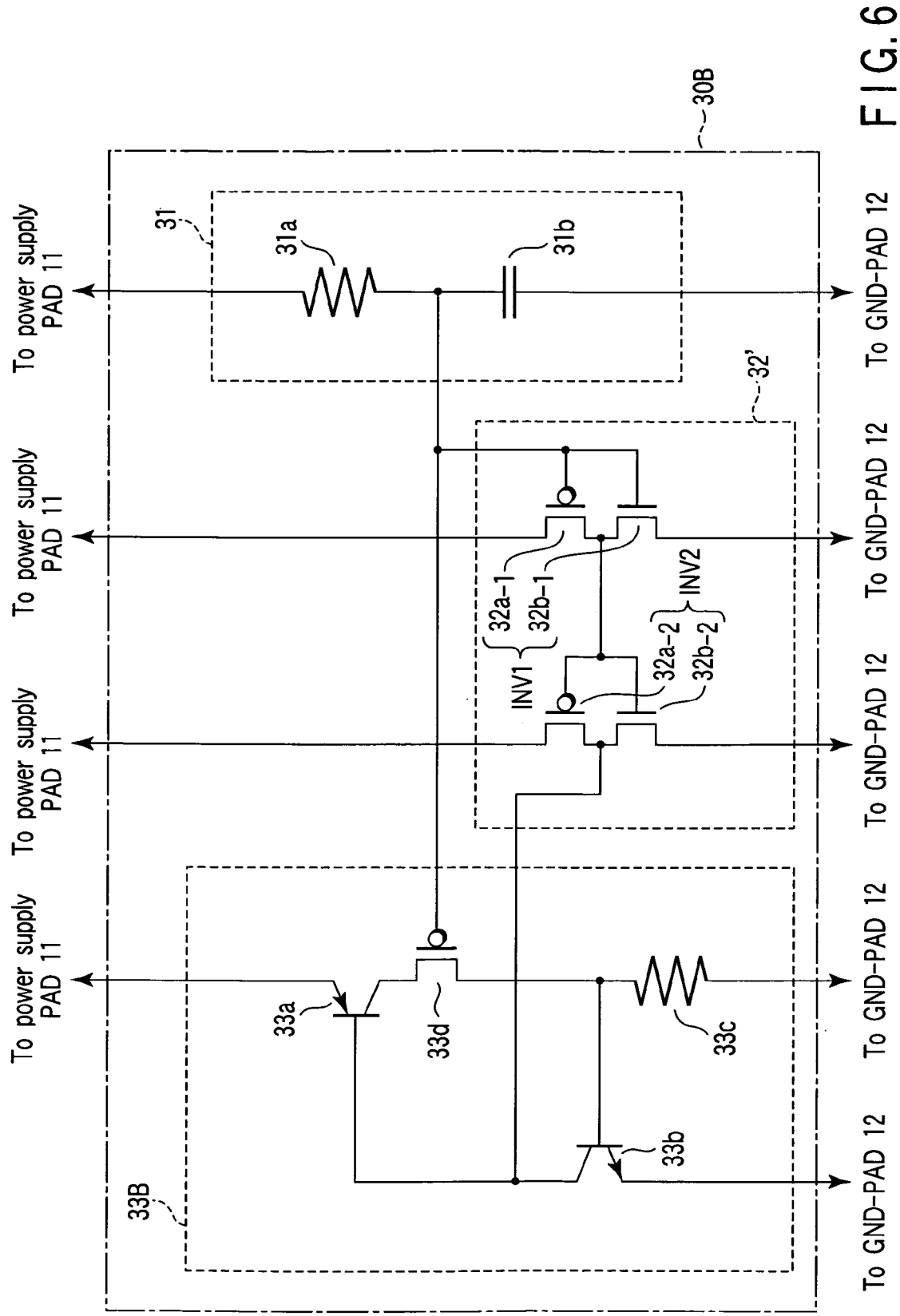
FIG. 6 is a circuit diagram showing the configuration of an ESD protection circuit according to a second embodiment of the present invention.

FIG. 6 shows the configuration of an ESD protection circuit according to a second embodiment of the present invention. Here, an AC trigger break-type thyristor is given as one example. The thyristor is used as a protection circuit, which is integrated on the same substrate together with the protection target, that is, a semiconductor integrated circuit to protect the gate oxide film of MOS integrated circuit. Incidentally, the same reference numerals are used to designate parts identical to FIG. 1, and the detailed explanation is omitted.

According to the second embodiment, a PMOS transistor 33d controlled by the output of a CR integrating circuit 31 electrically breaks a first current path in the normal operation, as shown in FIG. 6. The first current path connects the collector of a PNP transistor 33a and the base of an NPN transistor 33b in a thyristor 33B. In the second embodiment, a trigger circuit 32' comprises a two-stage CMOS structure inverter circuit, and the output terminal of the trigger circuit 32' is connected to the base of the PNP transistor 33a.

More specifically, in an ESD protection circuit 30B, the trigger circuit 32' comprises first and second CMOS structure inverter circuits INV1 and INV2. The first CMOS structure inverter circuit INV1 is composed of PMOS transistor $32a_{-1}$ and NMOS transistor $32b_{-1}$. The second CMOS structure inverter circuit INV2 is composed of PMOS transistor $32a_{-2}$ and NMOS transistor $32b_{-2}$. Each electrode of the inverter circuits INV1 and INV2, that is, each source of PMOS transistors $32a_{-1}$, $32a_{-2}$ and each source of NMOS transistors $32b_{-1}$, $32b_{-2}$ are connected to the power supply PAD 11 and the GND-PAD 12, respectively. Each gate electrode (input terminal of trigger circuit 32') of PMOS transistor $32a_{-1}$ and NMOS transistor $32b_{-1}$ of the inverter circuit INV1 is connected with the output terminal of the CR integrating circuit 31. The common drain of PMOS transistor $32a_{-1}$ and NMOS transistor $32b_{-1}$ is connected to each gate electrode of PMOS transistor $32a_{-2}$ and NMOS transistor $32b_{-2}$ of the inverter circuit INV2. The common drain (output terminal of trigger circuit 32') of PMOS transistor $32a_{-2}$ and NMOS transistor $32b_{-2}$ is connected to the base of the PNP transistor 33a and the collector of the NPN transistor 33b in the thyristor 33B.

The thyristor 33B has first and second paths (first and second connection wirings). The first path (first connection wiring) ranges from the collector of the PNP transistor 33a to the base of the NPN transistor 33b. The second path (second connection wiring) ranges from the base of the PNP transistor 33a to the collector of the NPN transistor 33b. The PMOS transistor 33d functioning as the switching element is inserted in the first path. The gate electrode of the PMOS transistor 33d is connected with the output terminal of the CR integrating circuit 31.

The operation of the ESD protection circuit 30B having the foregoing configuration will be explained below with reference to FIG. 6. First, the operation (protection operation) when ESD surge voltage is applied will be described. For example, a positive ESD surge voltage is applied between the power supply PAD 11 and the GND-PAD 12. Whereupon the trigger circuit 32' and the thyristor 33B are in an operating state by the voltage (Vdd) supplied from the power supply PAD 11. In addition, the output (intermediate node) CR integrating circuit 31 is held to GND potential (0 V) by the function of the capacitor element 31b. By doing so, the gate voltage of the PMOS transistor 33d becomes GND potential; therefore, the PMOS transistor 33d powers on.

On the other hand, the output of the trigger circuit 32' becomes the same 0 V as the input; therefore, a current from the GND-PAD 12 flows through the base-emitter junction of the PNP transistor 33a. As a result, the PNP transistor 33a becomes on state. In other words, a collector current flows to the PNP transistor 33a. Whereupon a current flows through the base of the NPN transistor 33b via the PMOS transistor 33d; therefore, the NPN transistor 33b becomes on state. The collector current of the NPN transistor 33b supplies base current of the PNP transistor 33a. Thus, positive feedback loop is formed. As a result, since the thyristor 33B causes snap back, the ESD protection circuit 30B becomes low impedance state capable of carrying large current from the power supply PAD 11 toward the GND-PAD 12. Therefore, the ESD surge current is discharged without stepping up the voltage (Vdd) from the power supply PAD 11. Consequently, there is no possibility that the semiconductor integrated circuit 20 is broken.

The normal operation (non-protection operation) of the ESD protection circuit 30B will be explained below. In a state that the voltage (Vdd) from the power supply PAD 11 has no change, the intermediate node of the CR integrating circuit 31 has Vdd potential by the function of the resistance element 31a. Thus, the output of the trigger circuit 32' becomes Vdd potential; therefore, the PNP transistor 33a becomes off state. In this case, since the PMOS transistor 33d is also in off state, feedback loop for causing snap back is cut off.

In the second embodiment, the thyristor 33B does not latch up in the normal operation. In other words, there is no need of considering the limitation that the voltage minimum value Vh after snap back must be set larger than the maximum guaranteed power-supply voltage Vddmax (Vh>Vddmax). Therefore, it is possible to reduce the device width or the necessary number of inserting the ESD protection circuits, like the first embodiment.

[Third Embodiment]

Figure 7:
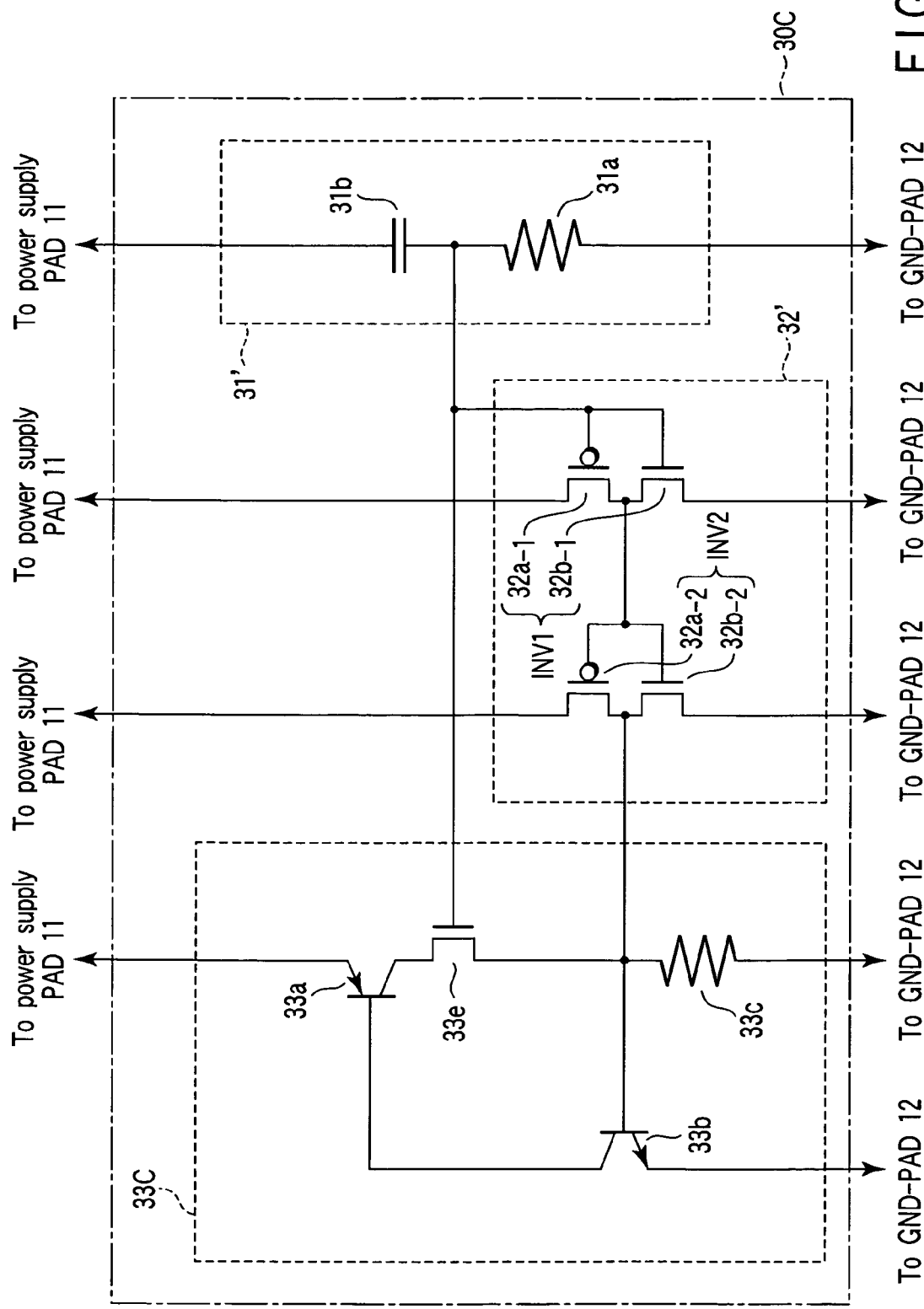
FIG. 7 is a circuit diagram showing the configuration of an ESD protection circuit according to a third embodiment of the present invention.

FIG. 7 shows the configuration of an ESD protection circuit according to a third embodiment of the present invention. Here, an AC trigger break-type thyristor is given as one example. The thyristor is used as a protection circuit, which is integrated on the same substrate together with the protection target, that is, a semiconductor integrated circuit to protect the gate oxide film of MOS integrated circuit. Incidentally, the same reference numerals are used to designate parts identical to FIG. 6, and the detailed explanation is omitted.

According to the third embodiment, an NMOS transistor 33e controlled by the output of a CR differentiating circuit 31' electrically breaks a first current path in the normal operation, as shown in FIG. 7. The first current path connects the collector of a PNP transistor 33a and the base of an NPN transistor 33b in a thyristor 33C. In the third embodiment, a trigger circuit 32' comprises a two-stage CMOS structure inverter circuit, like the second embodiment. The output terminal of the trigger circuit 32' is connected to the base of the NPN transistor 33b of the thyristor 33C.

In an ESD protection circuit 30C, the CR differentiating circuit 31' has the configuration that a resistance element (R) 31a and a capacitor element (C) 31b are connected in series between the power supply PAD 11 and the GND-PAD 12. The contact between two elements 31a and 31b, that is, an output terminal (intermediate terminal) of the CR differentiating circuit 31' is connected to an input terminal of the trigger circuit 32' and the gate electrode of the switching NMOS transistor 33e.

The thyristor 33C has first and second paths (first and second connection wirings). The first path (first connection wiring) ranges from the collector of the PNP transistor 33a to the base of the NPN transistor 33b. The second path (second connection wiring) ranges from the base of the PNP transistor 33a to the collector of the NPN transistor 33b. An NMOS transistor 33e functioning as the switching element is inserted in the first path. The output terminal of the trigger circuit 32' is connected to the base of the NPN transistor 33b, one end of the resistance element 33c and the drain of the NMOS transistor 33e.

The operation of the ESD protection circuit 30C having the foregoing configuration will be explained below with reference to FIG. 7. First, the operation (protection operation) when ESD surge voltage is applied will be described. For example, a positive ESD surge voltage is applied between the power supply PAD 11 and the GND-PAD 12. Whereupon the trigger circuit 32' and the thyristor 33C are in an operating state by the voltage (Vdd) supplied from the power supply PAD 11. In addition, the output (intermediate node) CR differentiating circuit 31' is held to Vdd potential by the function of the capacitor element 31b. By doing so, the gate voltage of the NMOS transistor 33e becomes Vdd potential; therefore, the NMOS transistor 33e powers on.

On the other hand, the output of the trigger circuit 32' becomes the same Vdd potential as the input; therefore, a current from the GND-PAD 12 flows through the base-emitter junction of the NPN transistor 33b. As a result, the NPN transistor 33b becomes on state. In other words, a collector current flows to the NPN transistor 33b. Whereupon a current flows to the base of the PNP transistor 33a; therefore, the PNP transistor 33a becomes on state. The collector current of the PNP transistor 33a supplies base current of the NPN transistor 33b via the NMOS transistor 33e. Thus, positive feedback loop is formed. As a result, since the thyristor 33C causes snap back, the ESD protection circuit 30C becomes low impedance state capable of carrying large current from the power supply PAD 11 toward the GND-PAD 12. Therefore, the ESD surge current is discharged without stepping up the voltage (Vdd) from the power supply PAD 11. Consequently, there is no possibility that the semiconductor integrated circuit 20 is broken.

The normal operation (non-protection operation) of the ESD protection circuit 30C will be explained below. In a state that the voltage (Vdd) from the power supply PAD 11 has no change, the intermediate node of the CR differentiating circuit 31' has GND potential (0 V) by the function of the resistance element 31a. Thus, the output of the trigger circuit 32' becomes GND potential; therefore, the NPN transistor 33b becomes off state. In this case, no current flows to PNP transistor 33a because the base current of the PNP transistor 33a is not supplied. In addition, the NMOS transistor 33e is also in off state; therefore, feedback loop for causing snap back is cut off. In other words, the thyristor 33C is in the cut-off state.

In the third embodiment, the thyristor 33C does not latch up in the normal operation. In other words, there is no need of considering the limitation that the voltage minimum value Vh after snap back must be set larger than the maximum guaranteed power-supply voltage Vddmax (Vh>Vddmax). Therefore, it is possible to reduce the device width or the necessary number of the ESD protection circuits to be inserted, like the first and second embodiments.

In general, the NMOS transistor has a current drive force of about two times as much as the PMOS transistor. Therefore, the size of the switching element can be reduced to about ½ of the first and second embodiments.

[Fourth Embodiment]

Figure 8:
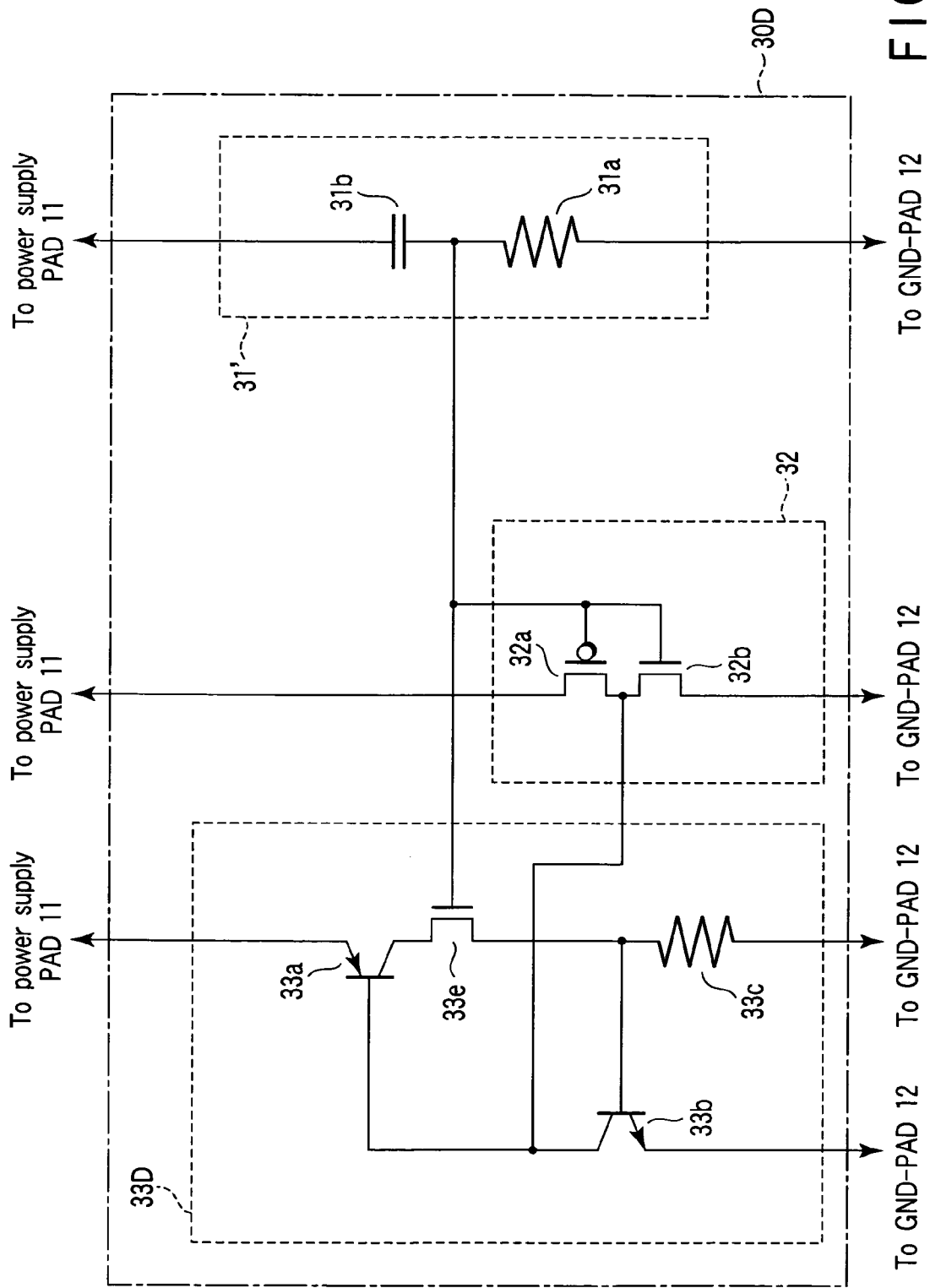
FIG. 8 is a circuit diagram showing the configuration of an ESD protection circuit according to a fourth embodiment of the present invention.

FIG. 8 shows the configuration of an ESD protection circuit according to a fourth embodiment of the present invention. Here, an AC trigger break-type thyristor is given as one example. The thyristor is used as a protection circuit, which is integrated on the same substrate together with the protection target, that is, a semiconductor integrated circuit to protect the gate oxide film of MOS integrated circuit. Incidentally, the same reference numerals are used to designate parts identical to FIG. 7, and the detailed explanation is omitted.

According to the fourth embodiment, an NMOS transistor 33e controlled by the output of a CR differentiating circuit 31' electrically breaks a first current path in the normal operation, as shown in FIG. 8. The first current path connects the collector of a PNP transistor 33a and the base of an NPN transistor 33b in a thyristor 33D. In the fourth embodiment, a trigger circuit 32 comprises a one-stage CMOS structure inverter circuit, like the first embodiment. The output terminal of the trigger circuit 32 is connected to the base of the PNP transistor 33a of the thyristor 33D.

In an ESD protection circuit 30D, the CR differentiating circuit 31' has the configuration that a resistance element (R) 31a and a capacitor element (C) 31b are connected in series between the power supply PAD 11 and the GND-PAD 12. The contact between two elements 31a and 31b, that is, an output terminal (intermediate terminal) of the CR differentiating circuit 31' is connected to an input terminal of the trigger circuit 32 and the gate electrode of the switching NMOS transistor 33e.

The thyristor 33D has first and second paths (first and second connection wirings). The first path (first connection wiring) ranges from the collector of the PNP transistor 33a to the base of the NPN transistor 33b. The second path (second connection wiring) ranges from the base of the PNP transistor 33a to the collector of the NPN transistor 33b. An NMOS transistor 33e functioning as the switching element is inserted in the first path. The output terminal of the trigger circuit 32 is connected to the base of the PNP transistor 33a and the collector of the NPN transistor 33b.

The operation of the ESD protection circuit 30D having the foregoing configuration will be explained below with reference to FIG. 8. First, the operation (protection operation) when ESD surge voltage is applied will be described. For example, a positive ESD surge voltage is applied between the power supply PAD 11 and the GND-PAD 12. Whereupon the trigger circuit 32 and the thyristor 33D are in an operating state by the voltage (Vdd) supplied from the power supply PAD 11. In addition, the output (intermediate node) CR differentiating circuit 31' is held to Vdd potential by the function of the capacitor element 31b. By doing so, the gate voltage of the NMOS transistor 33e becomes Vdd potential; therefore, the NMOS transistor 33e powers on. As a result, positive feedback loop is formed according to the same mechanism as the conventional case.

More specifically, the NMOS transistor 32b of the trigger circuit 32 is in the conductive state. Thus, a current from the power supply PAD 11 flows to the base-emitter junction of the PNP transistor 33a of the thyristor 33D. As a result, the PNP transistor 33a becomes on state. In other words, a collector current flows to the PNP transistor 33a. Whereupon a current flows to the base of the NPN transistor 33b via the NMOS transistor 33e; therefore, the NPN transistor 33b becomes on state. The collector current of the NPN transistor 33b supplies base current of the PNP transistor 33a. Thus, positive feedback loop is formed. As a result, since the thyristor 33D causes snap back, the ESD protection circuit 30D becomes low impedance state capable of carrying large current from the power supply PAD 11 toward the GND-PAD 12. Therefore, the ESD surge current is discharged without stepping up the voltage (Vdd) from the power supply PAD 11. Consequently, there is no possibility that the semiconductor integrated circuit 20 is broken.

The normal operation (non-protection operation) of the ESD protection circuit 30D will be explained below. In a state that the voltage (Vdd) from the power supply PAD 11 has no change, the intermediate node of the CR differentiating circuit 31' has GND potential (0 V) by the function of the resistance element 31a. Thus, the output of the trigger circuit 32 becomes GND potential; therefore, the NPN transistor 33b becomes off state. In this case, no current flows to PNP transistor 33a because the base current of the PNP transistor 33a is not supplied. In addition, the NMOS transistor 33e is also in off state; therefore, feedback loop for causing snap back is cut off. In other words, the thyristor 33D is in the cut-off state.

In the fourth embodiment, the thyristor 33D does not latch up in the normal operation. In other words, there is no need of considering the limitation that the voltage minimum value Vh after snap back must be set larger than the maximum guaranteed power-supply voltage Vddmax (Vh>Vddmax). Therefore, it is possible to greatly reduce the device width or the necessary number of the ESD protection circuits to be inserted, like the first to third embodiments.

In general, the NMOS transistor has a current drive force of about two times as much as the PMOS transistor. Therefore, the size of the switching element can be reduced to about ½ of the first and second embodiments.

According to the embodiments described above, the thyristor is prevented from latching up in the normal operation. Thus, the voltage minimum value Vh after snap back is set less than the power supply voltage (Vdd). As a result, a value allowable in the sum of on-resistance (required resistance value) Ron and interconnect resistances (R1+R2) in the conductive state after snap back of the ESD protection circuit is set higher. Therefore, it is possible to reduce the area of the ESD protection circuit occupied in the integrated circuit device or the number of the ESD protection circuit to be inserted.

In addition, both latch-up on-off control of the thyristor and trigger operation are realized according to a few circuit elements and relatively simple circuit configuration.

In particular, the NPN transistor has high HFE, so that the voltage minimum value Vh after snap back can be made small. Therefore, it is possible to further reduce the area of the ESD protection circuit occupied in the integrated circuit device or the number of the ESD protection circuit to be inserted.

In the foregoing embodiments, the switching MOS transistor is inserted in the first path (first connection wiring) ranging from the collector of the PNP transistor 33a to the base of the NPN transistor 33b. The present invention is not limited to the embodiments. For example, the switching MOS transistor may be inserted in the second path (second connection wiring) ranging from the base of the PNP transistor 33a to the collector of the NPN transistor 33b. The present invention is also applicable to the configuration described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device including a protection circuit protecting a semiconductor integrated circuit from electrostatic discharge,
the protection circuit comprising:
a detection circuit detecting the electrostatic discharge;
a trigger circuit generating a trigger signal based on the output signal of the detection circuit;
a thyristor having a PNP transistor and an NPN transistor, and operating by the trigger signal from the trigger circuit, the PNP transistor having an emitter connected to a first terminal of the semiconductor device, the NPN transistor having an emitter connected to a second terminal of the semiconductor device and a collector connected to base of the PNP transistor; and
a switching element controlling the connected between the PNP and NPN transistors in accordance with the output signal of the detection circuit.

2. The device according to claim 1, wherein the detection circuit is composed of a resistance element and a MOS (Metal Oxide Semiconductor) capacitor connected between the first and second terminals of the semiconductor device, and the output signal is fetched from the intermediate terminal.

3. The device according to claim 1, wherein the trigger circuit comprises an inverter circuit, which is composed of:
a first MOS (Metal Oxide Semiconductor) transistor having a source connected to the first terminal of the semiconductor device; and a second MOS transistor having a source connected to the second terminal of the semiconductor device and a drain connected in common with the first MOS transistor, wherein each gate of the transistors is inputted the output signal from the detection circuit,
the trigger circuit supplying the trigger signal from the commonly connected drain to a base of the NPN transistor.

4. The device according to claim 1, wherein the trigger circuit includes:
a first inverter circuit, which is composed of: a first MOS (Metal Oxide Semiconductor) transistor having a source connected to the first terminal of the semiconductor device; and a second MOS transistor having a source connected to the second terminal of the semiconductor device and a drain connected in common with the first MOS transistor, wherein each gate of the transistors is inputted the output signal from the detection circuit; and
a second inverter circuit, which is composed of: a third MOS transistor having a source connected to the first terminal of the semiconductor device; and a fourth MOS transistor having a source connected to the second terminal of the semiconductor device and a drain connected in common with the third MOS transistor, wherein each gate of the transistors is inputted with the output signal from the commonly connected drain in the first inverter circuit,
the trigger circuit supplying the trigger signal from the commonly connected drain in the second inverter circuit to a base of the PNP transistor.

5. The device according to claim 1, wherein the trigger circuit includes:
a first inverter circuit, which is composed of: a first MOS (Metal Oxide Semiconductor) transistor having a source connected to the first terminal of the semiconductor device; and a second MOS transistor having a source connected to the second terminal of the semiconductor device and a drain connected in common with the first MOS transistor, wherein each gate of the transistors is inputted the output signal from the detection circuit; and
a second inverter circuit, which is composed of: a third MOS transistor having a source connected to the first terminal of the semiconductor device; and a fourth MOS transistor having a source connected to the second terminal of the semiconductor device and a drain connected in common with the third MOS transistor, wherein each gate of the transistors is inputted with the output signal from the commonly connected drain in the first inverter circuit,
the trigger circuit supplying the trigger signal from the commonly connected drain in the second inverter circuit to a base of the NPN transistor.

6. The device according to claim 1, wherein the trigger circuit comprises an inverter circuit, which is composed of: a first MOS (Metal Oxide Semiconductor) transistor having a source connected to the first terminal of the semiconductor device; and a second MOS transistor having a source connected to the second terminal of the semiconductor device and a drain connected in common with the first MOS transistor, wherein each gate of the transistors is inputted the output signal from the detection circuit, the trigger circuit supplying the trigger signal from the commonly connected drain to a base of the PNP transistor.

7. The device according to claim 1, wherein the switching element is a P-channel MOS (Metal Oxide Semiconductor) transistor.

8. The device according to claim 1, wherein the switching element is formed in a well region formed with the PNP transistor via an isolation region.

9. The device according to claim 1, wherein a base length of the PNP transistor is smaller than a distance from the emitter to a well region formed with the NPN transistor, and a base length of the NPN transistor is smaller than a distance from the emitter to a well region formed with the PNP transistor.

10. The device according to claim 1, wherein the switching element is connected between a collector of the PNP transistor and a base of the NPN transistor.

11. The device according to claim 1, wherein the switching element is in an off state is when operating under normal power supply voltage.

12. The device according to claim 1, wherein the detection circuit is composed of a resistance element and a MOS (Metal Oxide Semiconductor) capacitor, the switching element is a P-channel MOS (Metal Oxide Semiconductor) transistor, and a gate of the P-channel MOS transistor is electrically connected to the first terminal via the resistance element.

13. The device according to claim 1, wherein the first terminal is intended to be supplied with power while the second terminal is intended to be grounded.

14. The device according to claim 2, wherein the resistance element is connected between the first terminal and an output signal of the detection circuit, and the MOS capacitor is connected between the second terminal and the output signal of the detection circuit.

15. The device according to claim 1, wherein the switching element is an N-channel MOS (Metal Oxide Semiconductor) transistor.

16. The device according to claim 2, wherein the MOS capacitor is connected between the first terminal and the output signal of the detection circuit, and the resistance element is connected between the second terminal and the output signal of the detection circuit.

17. A semiconductor device comprising:

a detection circuit connected between first and second terminals;

a trigger circuit connected between the first and second terminals, and generating a trigger signal in accordance with an output signal of the detection circuit;

a thyristor control circuit generating a thyristor control signal in accordance with the output signal of the detection circuit; and a thyristor connected between the first and second terminals so that the operation can be controlled based on the trigger signal and the thyristor control signal.

18. A semiconductor device comprising:

a semiconductor integrated circuit connected between first and second terminals;

a detection circuit connected between the first and second terminals;

a trigger circuit connected between the first and second terminals, and generating a trigger signal in accordance with an output signal of the detection circuit;

a thyristor control circuit generating a thyristor control signal in accordance with the output signal of the detection circuit;

a thyristor connected between the first and second terminals so that the operation can be controlled based on the trigger signal and the thyristor control signal; and a protection diode connected between the first and second terminals.

* * * * *